United States Patent
Ha et al.

(10) Patent No.: US 9,893,873 B2
(45) Date of Patent: Feb. 13, 2018

(54) ELECTRICAL POWER NETWORKS

(71) Applicant: ALSTOM Technology Ltd, Baden (CH)

(72) Inventors: Hengxu Ha, Stafford (GB); Sankara Subramanian Sri Gopala Krishna Murthi, Stafford (GB)

(73) Assignee: General Electric Technology GmbH, Baden (CH)

( * ) Notice: Subject to any disclaimer, the term of this patent is extended or adjusted under 35 U.S.C. 154(b) by 195 days.

(21) Appl. No.: 14/806,433

(22) Filed: Jul. 22, 2015

(65) Prior Publication Data
US 2016/0373236 A1    Dec. 22, 2016

(30) Foreign Application Priority Data

Jun. 19, 2015    (EP) ..................................... 15275158

(51) Int. Cl.
| | | |
|---|---|---|
| H04L 7/00 | (2006.01) | |
| H04J 3/06 | (2006.01) | |
| H02H 7/00 | (2006.01) | |
| G01R 31/08 | (2006.01) | |
| H02H 3/08 | (2006.01) | |
| H02H 7/26 | (2006.01) | |

(52) U.S. Cl.
CPC ............ *H04L 7/0008* (2013.01); *G01R 31/08* (2013.01); *H02H 3/083* (2013.01); *H02H 7/00* (2013.01); *H02H 7/262* (2013.01); *H04J 3/0638* (2013.01)

(58) Field of Classification Search
CPC ............................. H04L 7/0008; H04J 3/0638
See application file for complete search history.

(56) References Cited

U.S. PATENT DOCUMENTS

| | | | |
|---|---|---|---|
| 5,809,045 A | 9/1998 | Adamiak et al. | |
| 8,791,730 B2 | 7/2014 | Li et al. | |
| 2008/0137246 A1 | 6/2008 | Oda | |
| 2013/0181755 A1 | 7/2013 | Li et al. | |
| 2014/0118000 A1* | 5/2014 | Pan ........................ | G01R 31/08 324/537 |

FOREIGN PATENT DOCUMENTS

CA    2773193 A1    3/2011

* cited by examiner

*Primary Examiner* — Feben M Haile
(74) *Attorney, Agent, or Firm* — Foley & Lardner LLP

(57) ABSTRACT

A method of determining a communication time delay in a communication network between a local terminal and one or more remote terminals within an electrical power network includes: selecting, in respect of the or each remote terminal a calculation node in the electrical power network; calculating respective node currents flowing into the corresponding calculation node from the local terminal and the or each remote terminal; equating, in respect of the or each remote terminal, a sum of node currents flowing into the corresponding calculation node to zero according to Kirchhoff's first law; and extracting, in respect of the or each remote terminal, a communication time delay between the local terminal and the said respective remote terminal from a corresponding equated sum of node currents.

9 Claims, 3 Drawing Sheets

ELECTRICAL POWER NETWORKS

CROSS-REFERENCE TO RELATED PATENT APPLICATIONS

The present application claims the benefit of and priority to European Application No. 15275158, filed Jun. 19, 2015, which is incorporated herein by reference in its entirety.

BACKGROUND

This invention relates to a method of determining a communication time delay in a communication network between a local terminal and one or more remote terminals within an electrical power network.

Synchronization techniques play a very important role in line differential protection schemes which help to protect transmission lines within an electrical power system by identifying when a fault occurs in relation to the transmission lines. The basic principle of line differential protection is based on a comparison of a differential current (which is the direct summation of current samples or phasors of both a local and a remote terminal in the electrical power system) with a bias current (which is the summation of the amplitude of currents of both the local and remote terminals).

SUMMARY

One embodiment of the disclosure relates to a method of determining a communication time delay in a communication network between a local terminal and one or more remote terminals within an electrical power network. The method includes selecting, in respect of the or each remote terminal a calculation node in the electrical power network; calculating respective node currents flowing into the corresponding calculation node from the local terminal and the or each remote terminal; equating, in respect of the or each remote terminal, a sum of node currents flowing into the corresponding calculation node to zero according to Kirchhoff's first law; and extracting, in respect of the or each remote terminal, a communication time delay between the local terminal and the said respective remote terminal from a corresponding equated sum of node currents.

DETAILED DESCRIPTION

Figure 1:
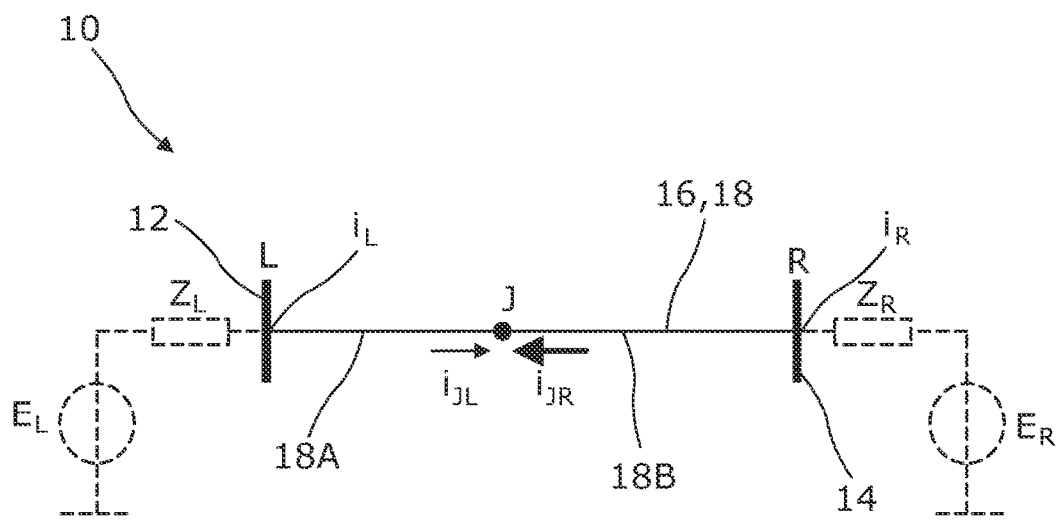
FIG. 1 shows a schematic representation of a first example electrical power network having a local terminal and a single remote terminal.

The basic principle of line differential protection is based on a comparison of a differential current (which is the direct summation of current samples or phasors of both a local and a remote terminal in the electrical power system) with a bias current (which is the summation of the amplitude of currents of both the local and remote terminals), that is:

$$\begin{cases} I_{\mathit{diff}} = | \dot{I}_L + \dot{I}_R | \\ I_{\mathit{bias}} = \frac{1}{2}(|\dot{I}_L| + |\dot{I}_R|) \end{cases}$$

where
$I_{\mathit{diff}}$ is differential current;
$I_{\mathit{bias}}$ is bias current;
$I_L$ is measured current at the local terminal; and
$I_R$ is the measured current received from the remote terminal.

If the received current from the remote terminal is strictly synchronized with the local current, then the differential current should be very small (theoretically zero) as there is no internal fault on the interconnecting transmission line. However, one must consider the time latency of the received current samples from the remote terminal compared with the current samples of the local terminal due to a delay imparted by communication of the measured current at the remote terminal from the remote terminal to the local terminal, and also the un-synchronized sampling of the current at the remote terminal. This time latency can lead to a significant increase in differential current, which in turn can result in mal-operation of the differential protection if an external fault occurs.

It is, therefore, necessary to employ a synchronization technique to enable time alignment of the local terminal current with the received current from the remote terminal. Traditionally Global Positioning System (GPS) based and echo-based processes, such as so-called 'Ping-Pong' techniques, have been used for synchronization, where GPS functions as the dominant synchronization element and Ping-Pong as a backup.

It is evident that GPS can provide synchronization which is adaptive not only for non-switched but also for switched communication networks. However, it is very costly and additionally, if the GPS signal is lost, it can lead to mal-operation. Meanwhile the Ping-Pong technique can only function correctly for non-switched networks where the forward and return communication paths are the same (i.e. the time delay from the local terminal to the remote terminal is the same as the delay from the remote terminal to the local terminal).

According to an aspect of the invention there is provided a method of determining a communication time delay in a communication network between a local terminal and one or more remote terminals within an electrical power network comprising the steps of:

(a) selecting, in respect of the or each remote terminal, a calculation node in the electrical power network;

(b) calculating respective node currents flowing into the corresponding calculation node from the local terminal and the or each remote terminal;

(c) equating, in respect of the or each remote terminal, a sum of node currents flowing into the corresponding calculation node to zero according to Kirchhoff's first law; and (d) extracting, in respect of the or each remote terminal, a communication time delay between the local terminal and the said respective remote terminal from a corresponding equated sum of node currents.

Equating, in respect of the or each remote terminal, a sum of node currents flowing into the corresponding calculation node to zero (and thereafter extracting a communication time delay from such an equated sum of node currents), i.e. utilising Kirchhoff's first law, is advantageous because it helps to isolate the method of the invention, and the or each communication time delay obtained thereby, from errors which might otherwise adversely affect the aforementioned differential current $I_{diff}$ and thereafter lead to erroneous activation of an associated differential protection scheme.

In particular, a consideration instead of differences in calculated voltages at a chosen calculation node in an electrical power network in order to establish a communication time delay can create a larger error in the differential current $I_{diff}$ value calculated therefrom as a result of only minor errors in the calculated voltages.

Preferably step (b) of calculating respective node currents flowing into the corresponding calculation node from the local terminal and the or each remote terminal includes calculating in respect of the or each remote terminal a corresponding remote node current flowing into the corresponding calculation node from the said remote terminal and a corresponding equivalent node current representative of the current flowing into the corresponding calculation node from the local terminal and any other remote terminals.

Such a step, and more particularly the calculation in respect of the or each remote terminal of a corresponding remote node current and a corresponding equivalent node current, provides the method of the invention with a desired degree of scalability and so permits its use with a wide range of different electrical power network configurations having, e.g. a significantly different number of remote terminals and/or junctions interconnecting those remote terminals.

In a preferred embodiment of the invention:

the or each corresponding equivalent node current is calculated by the local terminal;

the or each remote node current is calculated by the corresponding remote terminal and is thereafter transmitted via the communication network to the local terminal whereat it is received as a corresponding received remote node current; and step (c) of equating, in respect of the or each remote terminal, a sum of node currents flowing into the corresponding calculation node to zero according to Kirchhoff's first law, includes equating to zero in respect of the or each remote terminal the sum of the corresponding calculated equivalent node current and the corresponding received remote node current.

The foregoing steps desirably incorporate within the or each corresponding sum of node currents a communication time delay which represents the amount of time taken for the given calculated remote node current to travel (via the communication network) from the associated remote terminal to the local terminal.

Optionally, when applied to an electrical power network having a plurality of remote terminals, calculating in respect of the or each remote terminal a corresponding equivalent node current includes:

establishing an equivalent admittance for each remote terminal;

obtaining a local node current; and utilising the established equivalent admittances for each remote terminal and the local node current to calculate the corresponding equivalent node current.

The utilisation of established equivalent admittances for each remote terminal and the local node current to calculate the corresponding equivalent node current has the benefit of removing from such a calculation any unknowns, e.g. regarding the status of current flow, in respect of the or each corresponding equivalent node current, and so permits in subsequent step (d) the ready extraction of a corresponding communication time delay since the associated equated sum of node currents can be manipulated to include only one unknown, i.e. the required communication time delay.

In a method of determining a communication time delay according to another preferred embodiment of the invention, when applied to an electrical power network having a single junction between the local terminal and the plurality of remote terminals, utilising the established equivalent admittances for each remote terminal and the local node current to calculate the corresponding equivalent node current includes one of:

multiplying the local node current by a current distribution coefficient based on the said established equivalent admittances; and adding one or more other node currents, the or each of which is determined from the equivalent admittance of another remote terminal and a corresponding calculated node voltage, to the local node current.

Such steps desirably calculate the or each corresponding equivalent node current in a manner that can be readily scaled according to the number of remote terminals included in the particular electrical power network to which the method of the invention is applied.

Preferably, when applied to an electrical power network having a plurality of junctions between the local terminal and the plurality of remote terminals, utilising the established equivalent admittances for each remote terminal and the local node current to determine the corresponding equivalent node current includes:

using the local node current to calculate for each junction a local junction voltage; and multiplying the equivalent admittance for a given remote terminal by the calculated local junction voltage for the junction with which it is connected to thereby calculate the corresponding equivalent node current for the said given remote terminal.

Such steps desirably calculate the or each corresponding equivalent node current in a manner that can be readily scaled according to both the number of remote terminals and the number of junctions included in the particular electrical power network to which the method of the invention is applied.

Optionally calculating for each junction a local junction voltage includes:

formulating an initial admittance matrix based on the topology of the electrical power network;

modifying the initial admittance matrix to take account of the established equivalent admittances for each remote terminal; and combining the modified admittance matrix with the local node current to thereby establish each local junction voltage.

Such steps are again readily scalable according to the topology of the particular electrical power network to which the method of the invention is applied.

Calculating a corresponding equivalent node current may include obtaining a local node current by measuring the current at the local terminal and using the measured current at the local terminal to calculate the local node current using one of the following models of the network between the local terminal and a corresponding calculation node:

a resistor-inductor model;
a linear resistor-inductor-capacitor model; and
a distributed parameter model.

Obtaining the local node current in the foregoing manner includes a desired degree of flexibility so as to accommodate different electrical power network configurations, and more particularly different lengths and arrangements of transmission medium, i.e. transmission line or cable, between the local terminal and the corresponding calculation node.

Preferably calculating a given remote node current includes measuring the current at the corresponding remote terminal and using the measured current at the corresponding remote terminal to calculate the said given remote node current using one of the following models of the network between the corresponding remote terminal and the corresponding calculation node:
a resistor-inductor model;
a linear resistor-inductor-capacitor model; and
a distributed parameter model.

Calculating a given remote node current in the foregoing manner similarly includes a desired degree of flexibility so as to accommodate different electrical power network configurations, and more particularly different lengths and arrangements of transmission medium, i.e. transmission line or cable, between the corresponding remote terminal and the corresponding calculation node.

According to a further embodiment of the invention step (d) of extracting, in respect of the or each remote terminal, a communication time delay between the local terminal and the said respective remote terminal from a corresponding equated sum of node currents, includes comparing the phase of the node currents within the equated sum.

Comparing the phase of the node currents may include one of:
adopting a zero-crossing method in the time domain; and
adopting a Fourier transform method in the frequency domain.

Such steps can be readily implemented, e.g. in a respective microcontroller based calculation unit within the local terminal and the or each remote terminal, and is well-suited to identifying a time shift in current waveforms of the type calculated herein in respect of each node current.

A first example electrical power network is designated generally by reference numeral 10 and is shown schematically in FIG. 1.

The first electrical power network 10 includes first and second terminals 12, 14 that are interconnected by a portion of transmission medium 16 which, in the example shown is an overhead transmission line 18. In other arrangements of electrical power network (not shown) the transmission medium 16 may be an underground transmission cable.

Each terminal 12, 14 includes a protection device (not shown) which may, for example, be a circuit breaker. Each terminal 12, 14 also includes a control unit which may take the form of, e.g. a programmable microcontroller. Each control unit controls operation of the corresponding protection device and the control units are arranged in communication with one another via a communications network (not shown).

In the first electrical power network 10 shown the first terminal 12 is designated as a local terminal L and the second terminal 14 is designated as a remote terminal R, although this may be reversed in other example first electrical power networks. The local terminal L couples a local voltage source $E_L$ to the transmission medium 16, i.e. the overhead transmission line 18, while the remote terminal R couples a remote voltage source $E_R$ to the transmission medium 16.

An example method of determining a communication time delay $T_P$ in the communication network between the remote terminal R and the local terminal L.

The example method comprises the principal steps of:
(a) selecting, in respect of the remote terminal R, a calculation node in the first electrical power network 10;
(b) calculating respective node currents flowing into the calculation node from the local terminal L and the remote terminal R;
(c) equating, in respect of the remote terminal R, a sum of node currents flowing into the calculation node to zero according to Kirchhoff's first law; and
(d) extracting, in respect of the remote terminal R, a communication time delay $T_P$ between the local terminal L and the said remote terminal R from an equated sum of node currents.

The calculation node may be any point along the transmission line 18, and either the local terminal L or the remote terminal R may be chosen as the calculation node. In the example method described herein, by way of illustration, the calculation node is selected as being a junction J lying in the transmission line 18 between the local and remote terminals L, R.

Thereafter, step (b) of calculating respective node currents flowing into the calculation node from the local terminal L and the remote terminal R involves calculating, in respect of the remote terminal R, a remote node current $i_{JR}$ which flows into the calculation node, i.e. junction J, from the remote terminal R, and also an equivalent node current.

The equivalent node current should be representative of the current flowing into the calculation node J from the local terminal L and any other remote terminals. However, in respect of the example method, there are no other remote terminals and so the equivalent node current is equal solely to a local node current $i_{JL}$ which flows into the calculation node J from the local terminal L.

In the example method, the local node current $i_{JL}$ is obtained by measuring the current $i_L$ at the local terminal L and using the measured current $i_L$ at the local terminal L to calculate the local node current $i_{JL}$ using a resistor-inductor model of the network, i.e. overhead transmission line 18, between the local terminal L and the calculation node J.

More particularly the section 18A of overhead transmission line 18 between the local terminal L and the calculation node J is regarded as a resistor-inductor series-connected circuit and, because the section 18A is less than approximately 50 km, the shunt admittance can be neglected such that the local node current $i_{JL}$ is given by $$i_{JL}=i_L$$

A similar resistor-inductor model can be used in other example methods when applied to a network in which the corresponding section of transmission medium between the local terminal and the calculation node is defined by an underground cable that is less than approximately 3 km.

In other example methods, when applied to a network in which the section of transmission medium between the local terminal and the calculation node is defined either by an overhead transmission line between approximately 50 km and 150 km in length, or by an underground cable that is between approximately 3 km and 20 km in length, the local node current $i_{JL}$ can be obtained using a linear resistor-inductor-capacitor model of the aforesaid section of transmission medium, i.e. the parameters of resistance, inductance (or reactance) and shunt capacitance (or admittance) are considered to vary linearly along the said section. Such a linear resistor-inductor-capacitor model may also be known as a pi-equivalent circuit.

In such examples the local node current $i_{JL}$ can be obtained by a sample based method or by a Fourier phase based method.

In terms of the Fourier phase based method, the local node current $i_{JL}$ is given by $$\dot{I}_{JL} = \dot{I}_L - Y_{JL}\dot{U}_L/2$$

where, $\dot{I}_L$ is the Fourier phasor of measured current $i_L$ at the local terminal L;

$\dot{U}_L$ is the Fourier phasor of measured voltage $u_L$ at the local terminal L;

$\dot{I}_{JL}$ is the Fourier phasor of the local node current $i_{JL}$; and $Y_{JL}$ is the shunt admittance of the section 18A of transmission medium 16 between the local terminal L and the calculation node J.

With regards to the last parameter, i.e. the shunt admittance $Y_{JL}$, this can be determined by multiplying the admittance per length (which can be obtained from the operator of the transmission medium 16) by the total length of the section 18A.

In still further example methods, when applied to a network in which the section of transmission medium between the local terminal and the calculation node is defined either by an overhead transmission line over approximately 150 km in length, or by an underground cable that is over approximately 20 km in length, the local node current $i_{JL}$ can be obtained using a distributed parameter model of the aforesaid section of transmission medium.

In such examples the local node current $i_{JL}$ can be obtained by a sample based method or by a Fourier phase based method, with the Fourier phase based method yielding the local node current $i_{JL}$ according to $$\dot{I}_{JL} = \cos h(\gamma D)\dot{I}_L - \sin h(\gamma D)\dot{U}_L/Z_C$$

where, $\dot{I}_L$ is the Fourier phasor of measured current $i_L$ at the local terminal L;

$\dot{U}_L$ is the Fourier phasor of measured voltage $u_L$ at the local terminal L;

$\gamma = \sqrt{zy}$ is the propagation coefficient of the section of transmission medium, with z being the impedance per length and y being the shunt admittance per length of the transmission medium;

$Z_C = \sqrt{z/y}$ is the character impedance of the section of transmission medium, with z again being the impedance per length and y being the shunt admittance per length of the transmission medium; and D is the length of the section of transmission medium between the local terminal L and the calculation node J.

Meanwhile calculating, in respect of the remote terminal R, a remote node current $i_{JR}$ which flows into the calculation node J from the remote terminal R includes measuring the current $i_R$ at the remote terminal R and using the measured current $i_R$ to calculate the remote node current $i_{JR}$ using one of the same models of the network, i.e. section 18B of the overhead transmission line 18 between the remote terminal R and the calculation node J, as mentioned above, namely one of:

a resistor-inductor model;

a linear resistor-inductor-capacitor model; and a distributed parameter model.

By way of illustration, in relation to the example method and its application to the first example network 10 in which the section 18B of overhead transmission line 18 between the remote terminal R and the calculation node J is less than 50 km, a resistor-inductor model can be used with the shunt admittance again being neglected such that the remote node current $i_{JR}$ is calculated according to $$i_{JR} = i_R$$

In respect of the method, the equivalent local node current, i.e. the local node current $i_{JL}$, is calculated by the local terminal L, and more particularly by the control unit located therein. In addition, the remote node current $i_{JR}$ is calculated by the remote terminal, i.e. the control unit located therein, and is thereafter transmitted via the communication network to the local terminal L. The transmitted calculated remote node current $i_{JR}$ is received by the local terminal L as a received remote node current $i'_{JR}$. In this manner the received remote node current $i'_{JR}$ embodies the communication time delay $T_P$ between the remote terminal R and the local terminal L.

Thereafter step (c) of equating, in respect of the remote terminal R, a sum of node currents flowing into the calculation node J to zero according to Kirchhoff's first law, includes equating to zero the sum of the calculated equivalent node current, i.e. the obtained local node current $i_{JL}$, and the received remote node current $i'_{JR}$.

In other words, according to Kirchhoff's first law the sum of all currents flowing into the same node, i.e. the calculation node J, must be zero such that $$i_{JL} + i'_{JR} = 0$$

Subsequent to the foregoing, step (d) of extracting, in respect of the remote terminal R, a communication time delay $T_P$ between the local terminal L and the said remote terminal R from an equated sum of node currents, i.e. from the equated sum of the calculated equivalent node current $i_{JL}$ and the received remote node current $i'_{JR}$, includes comparing the phase of the said node currents $i_{JL}$, $i'_{JR}$.

Such a phase comparison can be achieved by adopting a zero-crossing method in the time domain or a Fourier transform method in the frequency domain.

By way of illustration, the example method adopts a Fourier transform method in which the received remote node current $i'_{JR}$ is rewritten in the form, $$\dot{I}'_{JR} e^{j\omega_0 T_P}$$

such that the communication time delay $T_P$ is given by $$T_P = \arg\left(\frac{-\dot{I}_{JL}}{\dot{I}'_{JR}}\right) / (2\pi f)$$

where, $\dot{I}_L$ is the Fourier phasor of the equivalent node current, i.e. the local node current $i_{JL}$;

$\dot{I}'_{JR}$ is the Fourier phasor of received remote node current $i'_{JR}$ transmitted from the remote terminal R to the local terminal L; and f is frequency of the node currents $i_{JL}$, $i'_{JR}$.

Following all of the above the example method optionally includes the further time alignment step of delaying the local data, i.e. the measured current $i_L$ at the local terminal L, so that it aligns correctly with the received remote node current $i'_{JR}$ transmitted from the remote terminal R, such that thereafter correct and reliable operation of an associated differential protection scheme can take place.

Figure 2:
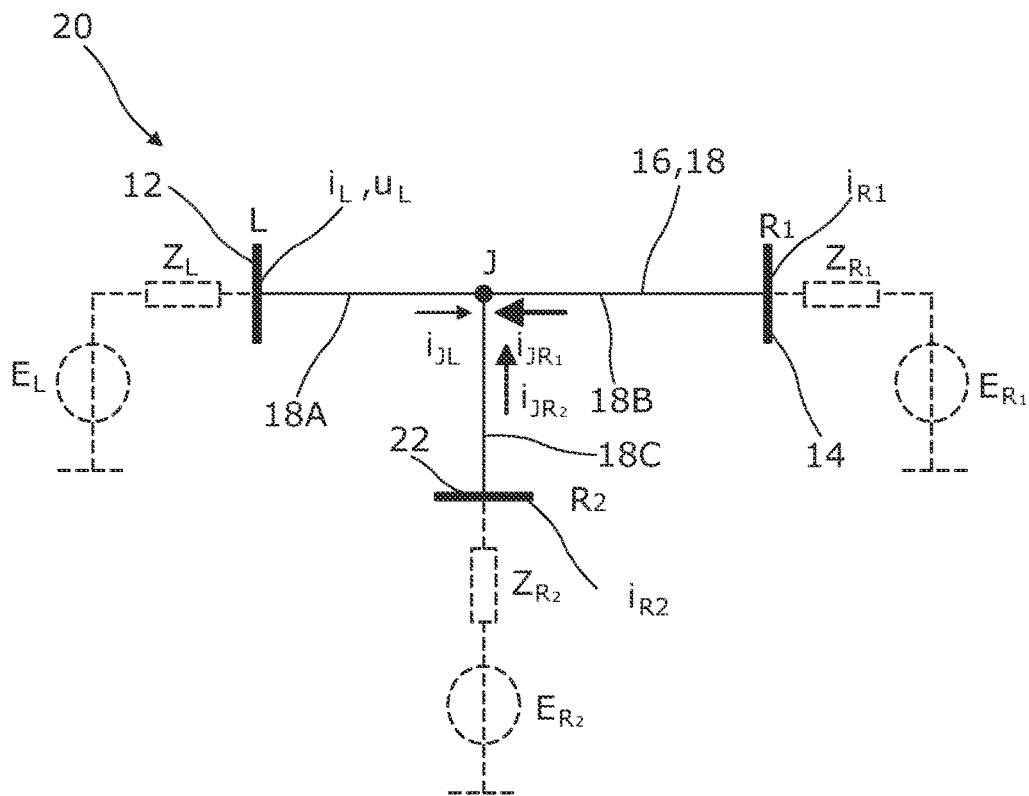
FIG. 2 shows a schematic representation of a second example electrical power network having a local terminal, a single junction and a plurality of remote terminals to which a method according to a first embodiment of the invention may be applied.

A second example electrical power network is designated generally by reference numeral 20 and is shown schematically in FIG. 2. The second electrical power network 20 is similar to the example first electrical power network 10 and like features share the same reference numerals.

The second electrical power network 20 includes first, second and third terminals 12, 14, 22 as well as a junction J. The terminals 12, 14, 22 and junction J are interconnected with one another by respective first, second and third sections 18A, 18B, 18C of a transmission medium 16 which, in the example shown, is again an overhead transmission line 18. In other arrangements of second electrical power network (not shown) one or more sections of the transmission medium 16 may be an underground transmission cable.

In the second electrical power network 20 the first terminal 12 is again designated as a local terminal L while the second terminal 14 is designated as a first remote terminal $R_1$ and the third terminal 22 is designated as a second remote terminal $R_2$. In other second electrical power networks (not shown) the terminals may be designated differently and there may be more than three terminals.

The local terminal L again couples a local voltage source $E_L$ to the first section 18A of the transmission medium 16, while the first remote terminal $R_1$ couples a first remote voltage source $E_{R1}$ to the second section 18B and the second remote terminal $R_2$ couples a second remote voltage source $E_{R2}$ to the third section 18C.

A method according to a first embodiment of the invention determines a first communication time delay $T_P1$ in the communication network between the first remote terminal $R_1$ and the local terminal L, and also a second communication time delay $T_P2$ between the second remote terminal $R_2$ and the local terminal L.

The first method of the invention comprises similar principal steps of:
(a) selecting, in respect of each remote terminal $R_1$, $R_2$, a calculation node in the second electrical power network 20;
(b) calculating respective node currents flowing into the corresponding calculation node from the local terminal L and each remote terminal $R_1$, $R_2$;
(c) equating, in respect of each remote terminal $R_1$, $R_2$, a sum of node currents flowing into the corresponding calculation node to zero according to Kirchhoff's first law; and
(d) extracting, in respect of each remote terminal $R_1$, $R_2$, a communication time delay $T_P1$, $T_P2$ between the local terminal L and the said respective remote terminal $R_1$, $R_2$ from a corresponding equated sum of node currents.

The same calculation node may be selected in respect of each remote terminal $R_1$, $R_2$, and it may again be any point within the transmission medium 16 but, by way of example, is selected as being the junction J lying between the local and remote terminals L, $R_1$, $R_2$.

In the first method of the invention, step (b) of calculating respective node currents flowing into the corresponding calculation node, i.e. the single junction J, from the local terminal L and each remote terminal $R_1$, $R_2$ involves various calculations in respect of each of the first and second remote terminals $R_1$, $R_2$.

Firstly, in respect of the first remote terminal $R_1$, a first remote node current $i_{JR1}$ which flows into the calculation node, i.e. junction J, from the first remote terminal $R_1$ is calculated, together with a first equivalent node current $i_{JR1\_L}$.

Secondly, in respect of the second remote terminal $R_2$, a second remote node current $i_{JR2}$ which flows into the calculation node J from the second remote terminal $R_2$ is calculated, as well as a second equivalent node current $i_{JR2\_L}$.

The first equivalent node current $i_{JR1\_L}$ is representative, with respect to the first remote terminal $R_1$, of the current flowing into the calculation node J and so comprises the local node current $i_{JL}$ which flows into the calculation node J from the local terminal L and the other node current $i_{JR2}$ that flows into the calculation node J from the other remote terminal, i.e. from the second remote terminal $R_2$.

Meanwhile the second equivalent node current $i_{JR2\_L}$ is similarly representative of the current flowing into the calculation node J from the point of view of the second remote terminal $R_2$, and so comprises the local node current $i_{JL}$ which flows into the calculation node J from the local terminal L, as well as the other node current $i_{JR1}$ that flows into the calculation node J from the other remote terminal, i.e. from the first remote terminal $R_1$.

In the first embodiment method, the local node current $i_{JL}$ is again obtained by measuring the current $i_L$ at the local terminal L and using the measured current $i_L$ at the local terminal L to calculate the local node current $i_{JL}$ using a resistor-inductor model of the first section 18A of transmission medium 16 between the local terminal L and the calculation node J.

By virtue of such steps the local node current $i_{JL}$ is again given by $$i_{JL}=i_L$$

In other embodiments of the first method of invention, depending of the length of transmission medium in question, a linear resistor-inductor-capacitor model or a distributed parameter model of the aforesaid section of transmission medium may instead be used.

Similarly, in the first method of the invention, calculating the first and second remote node currents $i_{JR1}$, $i_{JR2}$ includes measuring the current $i_{R1}$, $i_{R2}$ at the respective remote terminal $R_1$, $R_2$ and using the measured current $i_{R1}$, $i_{R2}$ to calculate the corresponding remote node current $i_{JR1}$, $i_{JR2}$ using an appropriate model of the section 18B, 18C of overhead transmission line 18 between the associated remote terminal $R_1$, $R_2$ and the calculation node J, i.e. one of:
a resistor-inductor model;
a linear resistor-inductor-capacitor model; and
a distributed parameter model.

Each equivalent node current $i_{JR1\_L}$, $i_{JR2\_L}$ is calculated by the local terminal L, and more particularly by the control unit located therein.

In the meantime, the first remote node current $i_{JR1}$ is calculated by the first remote terminal $R_1$, i.e. the control unit located therein, and the second remote node current $i_{JR2}$ is calculated by the second remote terminal $R_2$.

In each instance the corresponding remote terminal $R_1$, $R_2$ transmits to the local terminal L, via the communication network, the associated calculated remote node current $i_{JR1}$, $i_{JR2}$, whereat they are received as a respective first received remote node current $i'_{JR1}$ and a respective second received remote node current $i'_{JR2}$. In this manner the first and second received remote node currents $i'_{JR1}$, $i'_{JR2}$ embody a corresponding first communication time delay $T_P1$ between the first remote terminal $R_1$ and the local terminal L and a second communication time delay $T_P2$ between the second remote terminal $R_2$ and the local terminal L.

While the local terminal L, in calculating the first and second equivalent node current $i_{JR1\_L}$, $i_{JR2\_L}$, i.e. according to $$i_{JR1\_L} = i_{JL} + i_{JR2}; \text{ and}$$

$$i_{JR2\_L} = i_{JL} + i_{JR1}$$

could make use of the first and second received remote node currents $i'_{JR1}$, $i'_{JR2}$, this would introduce two unknowns, i.e. the first and second communication time delays $T_P1$, $T_P2$, at the next step, step (c), of equating to zero the sum of node currents flowing into the calculation node J, and thereby make it more difficult subsequently to extract each of the said communication time delays $T_P1$, $T_P2$.

Consequently, in the first method of the invention calculating each of the first and second equivalent node currents $i_{JR1\_L}$, $i_{JR2\_L}$ includes: establishing an equivalent admittance $y_{R1}$, $y_{R2}$ for each remote terminal $R_1$, $R_2$; obtaining the local node current $i_{JL}$; and utilising the established equivalent admittances $y_{R1}$, $y_{R2}$ for each remote terminal $R_1$, $R_2$ and the local node current $i_{JL}$ to calculate the corresponding equivalent node current $i_{JR1\_L}$, $i_{JR2\_L}$.

Figure 3:
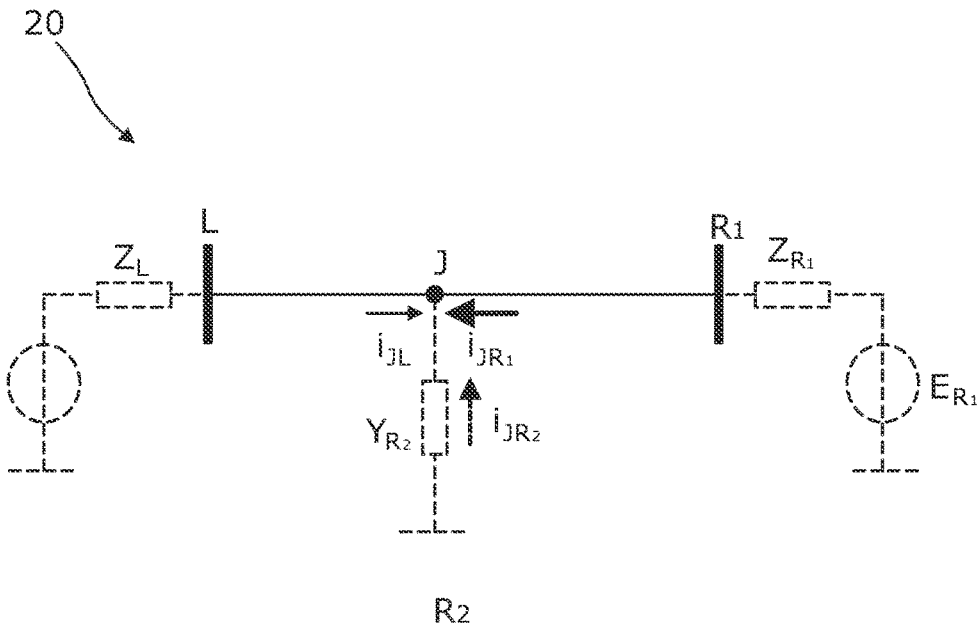
FIG. 3 shows a schematic representation of an equivalent version of the second example electrical power network shown in FIG. 2.

FIG. 3 shows one example of how the second remote node current $i_{JR2}$ flowing from the second remote terminal $R_2$ can be considered instead as an equivalent second admittance $y_{R2}$.

The equivalent admittance $y_{R1}$, $y_{R2}$ for each remote terminal $R_1$, $R_2$ may be established by a sample based method or a Fourier based method.

By way of example, the first method of the invention utilises a Fourier based method whereby $$Y_{R2} = -\frac{i'_{JR1}}{U'_{JR1}}$$

$$y_{R2} = -\frac{i'_{JR2}}{U'_{JR2}}$$

where, $i'_{JR1}$ is the Fourier phasor of the first received remote node current $i'_{JR1}$ which embodies the first communication time delay $T_P1$ between the first remote terminal $R_1$ and the local terminal L;

$U'_{JR1}$ is the Fourier phasor of a first received remote node voltage $u'_{JR1}$ which is calculated by the first remote terminal $R_1$ based on the voltage $u_{R1}$ measured at the first remote terminal $R_1$ and which again embodies the first communication time delay $T_P1$;

$I'_{JR2}$ is the Fourier phasor of the second received remote node current $i'_{JR2}$ which embodies the second communication time delay $T_P2$ between the second remote terminal $R_2$ and the local terminal L; and $U'_{JR2}$ is the Fourier phasor of a second received remote node voltage $u'_{JR2}$ which is calculated by the second remote terminal $R_2$ based on the voltage $u_{R2}$ measured at the second remote terminal $R_2$ and which again embodies the second communication time delay $T_P2$.

Meanwhile the local node current $i_{JL}$ is obtained in the same manner as described hereinabove.

Thereafter, in the first method of the invention, utilising the established equivalent admittances $y_{R1}$, $y_{R2}$ for each remote terminal $R_1$, $R_2$ and the local node current $i_{JL}$ to calculate the corresponding first and second equivalent node currents $i_{JR1\_L}$, $i_{JR2\_L}$, includes multiplying the local node current $i_{JL}$ by a current distribution coefficient based on the said established equivalent admittances $y_{R1}$, $y_{R2}$, i.e. according to $$I_{JR1\_L} = \frac{y_{R2}}{y_{R1} + y_{R2}} I_{JL}$$

$$I_{JR2\_L} = \frac{y_{R1}}{y_{R1} + y_{R2}} I_{JL}$$

where, $I_{JR1\_L}$ is the Fourier phasor of the first equivalent node current $i_{JR1\_L}$;

$I_{JR2\_L}$ is the Fourier phasor of the second equivalent node current $i_{JR2\_L}$; and $I_{JL}$ is the Fourier phasor of the local node current $i_{JL}$.

In other embodiments of the first method of the invention, utilising the established equivalent admittances $y_{R1}$, $y_{R2}$ for each remote $R_1$, $R_2$ and the local node current $i_{JL}$ to calculate the corresponding first and second equivalent node currents $i_{JR1\_L}$, $i_{JR2\_L}$, may include adding one or more other node currents, the or each of which is determined from the equivalent admittance $y_{R2}$, $y_{R1}$ of another remote terminal $R_2$, $R_1$ and a corresponding calculated node voltage, to the local node current, i.e. according to $$I_{JR1\_L} = I_{JL} + y_{R2} U_{JL}$$

$$I_{JR2\_L} = I_{JL} + y_{R1} U_{JL}$$

where, $I_{JR1\_L}$ is the Fourier phasor of the first equivalent node current $i_{JR1\_L}$;

$I_{JR2\_L}$ is the Fourier phasor of the second equivalent node current $i_{JR2\_L}$;

$I_{JL}$ is the Fourier phasor of the local node current $i_{JL}$; and $U_{JL}$ is the Fourier phasor of a node voltage $u_{JL}$ which is expected at the calculation node J and is calculated by the local terminal L based on a measured voltage $u_L$ at the local terminal L.

Thereafter step (c) of equating, in respect of each remote terminal $R_1$, $R_2$, a sum of node currents flowing into the calculation node J to zero according to Kirchhoff's first law, includes, for the first remote terminal $R_1$, equating to zero the sum of the first calculated equivalent node current $i_{JR1\_L}$ and the first received remote node current $i'_{JR1}$, and for the second remote terminal $R_2$, equating to zero the sum of the second calculated equivalent node current $i_{JR2\_L}$ and the second received remote node current $i'_{JR2}$.

In other words, according to Kirchhoff's first law the sum of all currents flowing into the same node, i.e. the calculation node J, must be zero such that in respect of the first remote terminal $R_1$ $$i_{JR1\_L} + i'_{JR1} = 0$$

and, in respect of the second remote terminal $R_2$ $$i_{JR2\_L} + i'_{JR2} = 0$$

Following the above, step (d) of extracting, in respect of each remote terminal $R_1$, $R_2$, a communication time delay $T_P1$, $T_P2$ between the local terminal L and the said respective remote terminal $R_1$, $R_2$ from a corresponding equated sum of node currents, i.e. from a corresponding one of the sums set out above, includes comparing the phase of the said node currents, i.e. comparing the phase of the first equivalent node current $i_{JR1\_L}$ with the phase of the first received remote node current $i'_{JR1}$, and comparing the phase of the second equivalent node current $i_{JR2\_L}$ with the phase of the second received remote node current $i'_{JR2}$.

Such phase comparisons can be achieved by adopting a zero-crossing method in the time domain or a Fourier transform method in the frequency domain.

By way of example, the first method of the invention again adopts a Fourier transform method in which each of the first and second received remote node currents $i'_{JR1}$, $i'_{JR2}$ is rewritten in the form, $$i'_{JR1}e^{j\omega_0 T_{p1}}; \text{ and}$$

$$i'_{JR2}e^{j\omega_0 T_{p2}}$$

such that the first communication time delay $T_P1$ is given by $$T_{p1} = \frac{\arg(-i_{JR1\_L}/i'_{JR1})}{2\pi f}$$

where, $i_{JR1\_L}$ is the Fourier phasor of the first equivalent node current $i_{JR1\_L}$;

$i'_{JR1}$ is the Fourier phasor of the first received remote node current $i'_{JR1}$ transmitted from the first remote terminal $R_1$ to the local terminal L; and f is frequency of the node currents $i_{JR1\_L}$, $i'_{JR1}$, and such that the second communication time delay $T_P2$ is given by $$T_{p2} = \frac{\arg(-i_{JR2\_L}/i'_{JR2})}{2\pi f}$$

where, $i_{JR2\_L}$ is the Fourier phasor of the second equivalent node current $i_{JR2\_L}$;

$i'_{JR2}$ is the Fourier phasor of the second received remote node current $i'_{JR2}$ transmitted from the second remote terminal $R_2$ to the local terminal L; and f is frequency of the node currents $i_{JR2\_L}$, $i'_{JR2}$.

Following all of the above the first method of the invention optionally includes a further time alignment step.

Such a step involves delaying the local data, i.e. the measured current $i_L$ at the local terminal L, by an amount $T_{max}$ equal to the maximum value of the first and second communication time delays $T_P1$, $T_P2$, i.e. where $$T_{max} = \max\{T_P1, T_P2\}$$

then delaying the first received remote node current $i'_{JR1}$ by an amount $T_{R1}$ given by $$T_{R1} = T_{max} - T_{P1}$$

and then delaying the second received remote node current $i'_{JR2}$ by an amount $T_{R2}$ given by $$T_{R2} = T_{max} - T_{P2}$$

Thereafter each of the local node current $i_{JL}$, and the first and second received remote node currents $i'_{JR1}$, $i'_{JR2}$ will be correctly synchronised with one another such that an associated differential protection scheme will be able to operate correctly and reliably.

Figure 4:
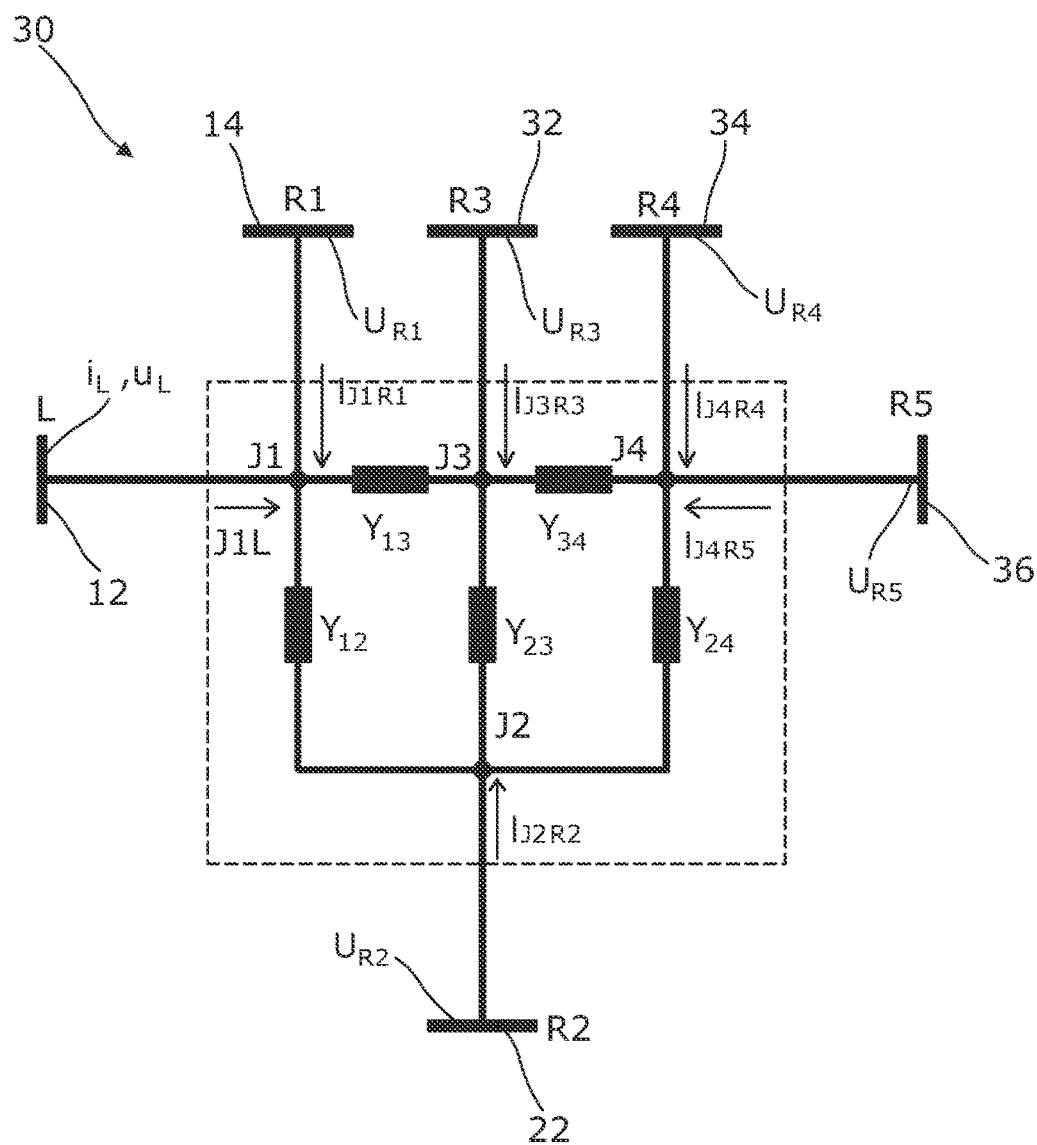
FIG. 4 shows a schematic representation of a third example electrical power network having a local terminal, a plurality of junctions and a plurality of remote terminals to which a method according to a second embodiment of the invention may be applied.

A third example electrical power network is designated generally by reference numeral 30 and is shown schematically in FIG. 4. The third electrical power network 30 is similar to the example second electrical power network 20 and like features share the same reference numerals.

The third electrical power network 30 includes first, second, third, fourth, fifth and sixth terminals 12, 14, 22, 32, 34, 36 as well as first, second, third and fourth junctions J1, J2, J3, J4. The terminals 12, 14, 22, 32, 34, 36 and junctions J1, J2, J3, J4 are interconnected with one another by respective sections of a transmission medium 16 which, in the example shown, are again sections of overhead transmission line 18. In other arrangements (not shown) of third electrical power network one or more sections of the transmission medium 16 may be an underground transmission cable.

In the third electrical power network 30 the first terminal 12 is again designated as a local terminal L, the second terminal 14 is again designated as a first remote terminal $R_1$ and the third terminal 22 is again designated as a second remote terminal $R_2$, while the fourth terminal 32 is designated as a third remote terminal $R_3$, the fifth terminal 34 is designated as a fourth remote terminal $R_4$ and the sixth terminal 36 is designated as a fifth remote terminal $R_5$. In other third electrical power networks (not shown) the terminals may be designated differently, there may be fewer than or more than six terminals, fewer than or more than four junctions, and the various junctions and terminals may be configured differently to the arrangement shown in FIG. 4.

A method according to a second embodiment of the invention determines a first communication time delay $T_P1$ in the communication network between the first remote terminal $R_1$ and the local terminal L, a second communication time delay $T_P2$ between the second remote terminal $R_2$ and the local terminal L, a third communication time delay $T_P3$ between the third remote terminal $R_3$ and the local terminal L, a fourth communication time delay $T_P4$ between the fourth remote terminal $R_4$ and the local terminal L, and a fifth communication time delay $T_P5$ between the fifth remote terminal $R_5$ and the local terminal L.

The second method of the invention is comparable to the first method of the invention and similarly comprises principal steps of:

(a) selecting, in respect of each remote terminal $R_1$, $R_2$, $R_3$, $R_4$, $R_5$, a calculation node in the third electrical power network 30;

(b) calculating respective node currents flowing into the corresponding calculation node from the local terminal L and each remote terminal $R_1$, $R_2$, $R_3$, $R_4$, $R_5$;

(c) equating, in respect of each remote terminal $R_1$, $R_2$, $R_3$, $R_4$, $R_5$, a sum of node currents flowing into the corresponding calculation node to zero according to Kirchhoff's first law; and (d) extracting, in respect of each remote terminal $R_1$, $R_2$, $R_3$, $R_4$, $R_5$, a communication time delay $T_P1$, $T_P2$, $T_P3$, $T_P4$, $T_P5$ between the local terminal L and the said respective remote terminal $R_1$, $R_2$, $R_3$, $R_4$, $R_5$ from a corresponding equated sum of node currents.

The calculation node may again be any point within the transmission medium 16 but, by way of example, is selected as being the junction with which the corresponding remote terminal is directly connected, i.e. the first junction J1 with respect to the first remote terminal $R_1$, the second junction J2 with respect to the second remote terminal $R_2$, the third junction J3 with respect to the third remote terminal $R_3$, the fourth junction J4 with respect to the fourth remote terminal $R_4$, and the fourth junction J4 again with respect to the fifth remote terminal $R_5$.

In the second method of the invention, step (b) of calculating respective node currents flowing into the corresponding calculation node from the local terminal L and each remote terminal $R_1$, $R_2$, $R_3$, $R_4$, $R_5$ involves calculating respective:
(i) first, second, third, fourth and fifth remote node currents currents $i_{J1R1}$, $i_{J2R2}$, $i_{J3R3}$, $i_{J4R4}$, $i_{J4R5}$, which flow into a corresponding junction J1, J2, J3, J4 from each of the remote terminals $R_1$, $R_2$, $R_3$, $R_4$, $R_5$; and
(ii) first, second, third, fourth and fifth equivalent node currents $i_{J1R1}$, $i_{J2R2}$, $i_{J3R3}$, $i_{J4R4}$, $i_{J4R5}$.

In respect of each remote terminal $R_1$, $R_2$, $R_3$, $R_4$, $R_5$, the corresponding equivalent node current $i_{J1R1\_L}$, $i_{J2R2\_L}$, $i_{J3R3\_L}$, $i_{J4R4\_L}$, $i_{J4R5\_L}$ is representative of the current which flows into the corresponding calculation node J1, J2, J3, J4 from the local terminal L and the other remote terminals $R_1$, $R_2$, $R_3$, $R_4$, $R_5$, i.e. with respect to the first remote terminal $R_1$ then the first equivalent node current $i_{J1R1\_L}$ is representative of the current flowing into the first junction J1, i.e. the junction with which the first remote terminal $R_1$ is directly connected, from the local terminal L and each of the other remote terminals, i.e. each of the second, third, fourth and fifth remote terminals $R_2$, $R_3$, $R_4$, $R_5$.

In the second method of the invention, calculating the first, second, third, fourth and fifth remote node currents $i_{J1R1}$, $i_{J2R2}$, $i_{J3R3}$, $i_{J4R4}$, $i_{J4R5}$ similarly includes measuring the current at the respective remote terminal $R_1$, $R_2$, $R_3$, $R_4$, $R_5$ and using the measured current to calculate the corresponding remote node current $i_{J1R1}$, $i_{J2R2}$, $i_{J3R3}$, $i_{J4R4}$, $i_{J4R5}$ using an appropriate model of the section of overhead transmission line 18 between the associated remote terminal $R_1$, $R_2$, $R_3$, $R_4$, $R_5$ and the junction J1, J2, J3, J4 into which the remote node current is flowing, i.e. one of:
a resistor-inductor model;
a linear resistor-inductor-capacitor model; and
a distributed parameter model.

Each equivalent node current $i_{J1R1\_L}$, $i_{J2R2\_L}$, $i_{J3R3\_L}$, $i_{J4R4\_L}$, $i_{J4R5\_L}$ is calculated by the local terminal L, and more particularly by the control unit located therein.

In the meantime, each of the respective remote node currents $i_{J1R1}$, $i_{J2R2}$, $i_{J3R3}$, $i_{J4R4}$, $i_{J4R5}$ is calculated by the corresponding remote terminal $R_1$, $R_2$, $R_3$, $R_4$, $R_5$.

The corresponding remote terminal $R_1$, $R_2$, $R_3$, $R_4$, $R_5$ then transmits to the local terminal L, via the communication network, the associated calculated remote node current $i_{J1R1}$, $i_{J2R2}$, $i_{J3R3}$, $i_{J4R4}$, $i_{J4R5}$ whereat they are received as respective first, second, third, fourth and fifth received remote node currents $i'_{J1R1}$, $i'_{J2R2}$, $i'_{J3R3}$, $i'_{J4R4}$, $i'_{J4R5}$.

In this manner each of the received remote node currents $i'_{J1R1}$, $i'_{J2R2}$, $i'_{J3R3}$, $i'_{J4R4}$, $i'_{J4R5}$ embodies a corresponding communication time delay $T_P1$, $T_P2$, $T_P3$, $T_P4$, $T_P5$ between the local terminal L and the corresponding remote terminal $R_1$, $R_2$, $R_3$, $R_4$, $R_5$.

In the second method of the invention calculating each of the equivalent node currents $i_{J1R1\_L}$, $i_{J2R2\_L}$, $i_{J3R3\_L}$, $i_{J4R4\_L}$, $i_{J4R5\_L}$ again includes:
establishing an equivalent admittance $y_{R1}$, $y_{R2}$, $y_{R3}$, $y_{R4}$, $y_{R5}$ for each remote terminal $R_1$, $R_2$, $R_3$, $R_4$, $R_5$;
obtaining a local node current $i_{J1L}$; and
utilising the established equivalent admittances $y_{R1}$, $y_{R2}$, $y_{R3}$, $y_{R4}$, $y_{R5}$ for each remote terminal $R_1$, $R_2$, $R_3$, $R_4$, $R_5$ and the local node current $i_{J1L}$ to calculate the corresponding equivalent node current $i_{J1R1\_L}$, $i_{J2R2\_L}$, $i_{J3R3\_L}$, $i_{J4R4\_L}$, $i_{J4R5\_L}$.

The equivalent admittance $y_{R1}$, $y_{R2}$, $y_{R3}$, $y_{R4}$, $y_{R5}$ for each remote terminal $R_1$, $R_2$, $R_3$, $R_4$, $R_5$ may again be established by a sample based method or a Fourier based method.

By way of example, the second method of the invention again utilises a Fourier based method whereby $$y_{R1} = \frac{I'_{J1R1}}{\dot{U}'_{J1R1}}$$

$$y_{R2} = \frac{I'_{J2R2}}{\dot{U}'_{J2R2}}$$

$$y_{R3} = \frac{I'_{J3R3}}{\dot{U}'_{J3R3}}$$

$$y_{R4} = \frac{I'_{J4R4}}{\dot{U}'_{J4R4}}$$

$$y_{R5} = \frac{I'_{J4R5}}{\dot{U}'_{J4R5}}$$

where, $\dot{I}'_{J1R1}$ is the Fourier phasor of the first received remote node current $i'_{J1R1}$ which embodies the first communication time delay $T_P1$ between the first remote terminal $R_1$ and the local terminal L;

$\dot{U}'_{J1R1}$ is the Fourier phasor of a first received remote node voltage $u'_{J1R1}$ which is calculated by the first remote terminal $R_1$ based on the voltage $u_{R1}$ measured at the first remote terminal $R_1$ and which again embodies the first communication time delay $T_P1$;

$\dot{I}'_{J2R2}$ is the Fourier phasor of the second received remote node $i'_{J2R2}$ which embodies the second communication time delay $T_P2$ between the second remote terminal $R_2$ and the local terminal L;

$\dot{U}'_{J2R2}$ is the Fourier phasor of a second received remote node voltage $u'_{J2R2}$ which is calculated by the second remote terminal $R_2$ based on the voltage $u_{R2}$ measured at the second remote terminal $R_2$ and which again embodies the second communication time delay $T_P2$;

$\dot{I}'_{J3R3}$ is the Fourier phasor of the third received remote node $i'_{J3R3}$ which embodies the third communication time delay $T_P3$ between the third remote terminal $R_3$ and the local terminal L;

$\dot{U}'_{J3R3}$ is the Fourier phasor of a third received remote node voltage $u'_{J3R3}$ which is calculated by the third remote terminal $R_3$ based on the voltage $u_{R3}$ measured at the third remote terminal $R_3$ and which again embodies the third communication time delay $T_P3$;

$\dot{I}_{J4R4}$ is the Fourier phasor of the fourth received remote node $i'_{J4R4}$ which embodies the fourth communication time delay $T_P4$ between the fourth remote terminal $R_4$ and the local terminal L;

$\dot{U}'_{J4R4}$ is the Fourier phasor of a fourth received remote node voltage $u'_{J4R4}$ which is calculated by the fourth remote terminal $R_4$ based on the voltage $u_{R4}$ measured at the fourth remote terminal $R_4$ and which again embodies the fourth communication time delay $T_P4$;

$\dot{I}_{J4R4}$ is the Fourier phasor of the fifth received remote node $i'_{J4R5}$ which embodies the fifth communication time delay $T_P5$ between the fifth remote terminal $R_5$ and the local terminal L; and $\dot{U}'_{J4R5}$ is the Fourier phasor of a fifth received remote node $u'_{J4R5}$ which is calculated by the fifth remote terminal $R_5$ based on the voltage $u_{R5}$ measured at the fifth remote terminal $R_5$ and which again embodies the fifth communication time delay $T_P5$.

Meanwhile the local node current $i_{J1L}$ is again obtained by measuring the current $i_L$ at the local terminal L and using that measured current $i_L$ to calculate the local node current $i_{J1L}$ using a resistor-inductor model of the section of transmission medium 16 between the local terminal L and a corresponding calculation node which, in the third method of the invention, is chosen as the first junction J1.

By virtue of such steps the local node current $i_{J1L}$ is again given by $$i_{J1L} = i_L$$

In other embodiments of the second method of invention, depending of the length of transmission medium in question, a linear resistor-inductor-capacitor model or a distributed parameter model of the aforesaid section of transmission medium may instead be used.

Thereafter, in the second method of the invention, utilising the established equivalent admittances $y_{R1}$, $y_{R2}$, $y_{R3}$, $y_{R4}$, $y_{R5}$ for each remote terminal $R_1$, $R_2$, $R_3$, $R_4$, $R5$ and the local node current $i_{J1L}$ to calculate the corresponding equivalent node current $i_{J1R1\_L}$, $i_{J2R2\_L}$, $i_{J3R3\_L}$, $i_{J4R4\_L}$, $i_{J4R5\_L}$, includes:

using the local node current $i_{J1L}$ to calculate for each junction J1, J2, J3, J4 a local junction voltage $u_{J1\_L}$, $u_{J2\_L}$, $u_{J3\_L}$, $u_{J4\_L}$; and multiplying the equivalent admittance $y_{R1}$, $y_{R2}$, $y_{R3}$, $y_{R4}$, $y_{R5}$ for a given remote terminal $R_1$, $R_2$, $R_3$, $R_4$, $R_5$ by the calculated local junction voltage $u_{J1\_L}$, $u_{J2\_L}$, $u_{J3\_L}$, $u_{J4\_L}$ for the junction J1, J2, J3, J4 with which it is connected to thereby calculate the corresponding equivalent node current $i_{J1R1\_L}$, $i_{J2R2\_L}$, $i_{J3R3\_L}$, $i_{J4R4\_L}$, $i_{J4R5\_L}$, for the said given remote terminal $R_1$, $R_2$, $R_3$, $R_4$, $R_5$, i.e. according to $$\dot{I}_{J1R1\_L} = y_{R1} \dot{U}_{J1\_L}$$

$$\dot{I}_{J2R2\_L} = y_{R2} \dot{U}_{J2\_L}$$

$$\dot{I}_{J3R3\_L} = y_{R3} \dot{U}_{J3\_L}$$

$$\dot{I}_{J4R4\_L} = y_{R4} \dot{U}_{J4\_L}$$

$$\dot{I}_{J4R5\_L} = y_{R5} \dot{U}_{J4\_L}$$

where, $\dot{I}_{J1R1\_L}$ is the Fourier phasor of the first equivalent node current $i_{J1R1\_L}$;

$\dot{I}_{J2R2\_L}$ is the Fourier phasor of the second equivalent node current $i_{J2R2\_L}$;

$\dot{I}_{J3R3\_L}$ is the Fourier phasor of the third equivalent node current $i_{J3R3\_L}$;

$\dot{I}_{J4R4\_L}$ is the Fourier phasor of the fourth equivalent node current $i_{J4R4\_L}$;

$\dot{I}_{J4R5\_L}$ is the Fourier phasor of the fifth equivalent node current $i_{J4R5\_L}$;

$\dot{U}_{J1\_L}$ is the Fourier phasor of the first junction voltage $u_{J1\_L}$;

$\dot{U}_{J2\_L}$ is the Fourier phasor of the second junction voltage $u_{J2\_L}$;

$\dot{U}_{J3\_L}$ is the Fourier phasor of the third junction voltage $u_{J3\_L}$; and $\dot{U}_{J4\_L}$ is the Fourier phasor of the fourth junction voltage $u_{J4\_L}$.

In each instance, calculating for each junction J1, J2, J3, J4 a local junction voltage $u_{J1\_L}$, $u_{J2\_L}$, $u_{J3\_L}$, $u_{J4\_L}$ includes:

formulating an initial admittance matrix based on the topology of the third example electrical power network 30;

modifying the initial admittance matrix to take account of the established equivalent admittances $y_{R1}$, $y_{R2}$, $y_{R3}$, $y_{R4}$, $y_{R5}$ for each remote terminal $R_1$, $R_2$, $R_3$, $R_4$, $R5$; and combining the modified admittance matrix with the local node current $i_{J1L}$ to thereby establish each local junction voltage $u_{J1\_L}$, $u_{J2\_L}$, $u_{J3\_L}$, $u_{J4\_L}$.

In the second method of the invention, the local junction voltages $u_{J1\_L}$, $u_{J2\_L}$, $u_{J3\_L}$, $u_{J4\_L}$ are calculated on the basis of the local node current $i_{J1L}$ with the portion of network, i.e. network branch, associated with each remote terminal $R_1$, $R_2$, $R_3$, $R_4$, $R_5$ being regarded as an equivalent admittance.

More particularly an initial admittance matrix $y_{J0}$ is formulated according to the topology of the third example electrical power network 30, together with information provided by the network owner regarding the section admittance $y_{12}$, $y_{13}$, $y_{23}$, $y_{24}$, $y_{34}$ of the various sections of transmission medium 16 between the junctions J1, J2, J3, J4.

An example initial admittance matrix $y_{J0}$ is shown below in which each of the diagonal entries is the summation of all of the section admittances $y_{12}$, $y_{13}$, $y_{23}$, $y_{24}$, $y_{34}$ that are directly connected to the corresponding junction J1, J2, J3, J4, e.g. for the row 2, column 2 diagonal entry the section admittances directly connected to the second junction J2 are $y_{13} + y_{23} + y_{24}$, i.e.

$$Y_{J0} = \begin{bmatrix} y_{12} + y_{13} & -y_{12} & -y_{13} & 0 \\ -y_{12} & y_{12} + y_{23} + y_{24} & -y_{23} & -y_{24} \\ -y_{13} & -y_{23} & y_{13} + y_{23} + y_{34} & -y_{34} \\ 0 & -y_{24} & -y_{34} & y_{24} + y_{34} \end{bmatrix}$$

In addition, the remaining row and column entries are the section admittance which is directly connected between the two junctions in question multiplied by −1, e.g. the admittance connected directly between the third junction J3 (i.e. row 3) and the first junction J1 (i.e. column 1) is $y_{13}$, and so the entry at row 3, column 1 is $-y_{13}$.

The initial admittance matrix $y_{J0}$ is then modified to take account of the equivalent admittances $y_{R1}$, $y_{R2}$, $y_{R3}$, $y_{R4}$, $y_{R5}$ of the remote terminals $R_1$, $R_2$, $R_3$, $R_4$, $R_5$ according to a topology matrix $M_{TOP}$ which takes the following form:

$$M_{TOP} = \begin{bmatrix} & J1 & J2 & J3 & J4 \\ L & 1 & 0 & 0 & 0 \\ R1 & 1 & 0 & 0 & 0 \\ R2 & 0 & 1 & 0 & 0 \\ R3 & 0 & 0 & 1 & 0 \\ R4 & 0 & 0 & 0 & 1 \\ R5 & 0 & 0 & 0 & 1 \end{bmatrix}$$

The rows in the aforementioned topology matrix $M_{TOP}$ represent the corresponding terminal L, $R_1$, $R_2$, $R_3$, $R_4$, $R_5$ and the columns represent the corresponding junction J1, J2, J3, J4. If a particular terminal L, $R_1$, $R_2$, $R_3$, $R_4$, $R_5$ is connected to a given junction J1, J2, J3, J4 then the corresponding matrix entry is 1 (otherwise a 0 is included).

The diagonal elements of the initial admittance matrix $y_{J0}$ are then modified by subtracting the equivalent admittance $y_{R1}$, $y_{R2}$, $y_{R3}$, $y_{R4}$, $y_{R5}$ of the or each remote terminal $R_1$, $R_2$, $R_3$, $R_4$, $R_5$ that is directly connected to the corresponding junction J1, J2, J3, J4, e.g. for the fourth junction J4 the entry at (4,4) in the initial admittance matrix $y_{J0}$ is modified by subtracting the equivalent admittance of the fourth and fifth remote terminals $R_4$, $R_5$, i.e. by subtracting $y_{R4}$ and $y_{R5}$, such that the modified admittance matrix $y_{JMod}$ takes the form $$Y_{JMod} = \begin{bmatrix} y_{12} + y_{13} - y_{R1} & -y_{12} & -y_{13} & 0 \\ -y_{12} & y_{12} + y_{23} + y_{24} - y_{R2} & -y_{23} & -y_{24} \\ -y_{13} & -y_{23} & y_{13} + y_{23} + y_{34} - y_{R3} & -y_{34} \\ 0 & -y_{24} & -y_{34} & y_{24} + y_{34} - y_{R4} - y_{R5} \end{bmatrix}$$

Each junction voltage $u_{J1\_L}$, $u_{J2\_L}$, $u_{J3\_L}$, $u_{J4\_L}$ is then calculated according to the following $$\begin{bmatrix} \dot{U}_{J1\_L} \\ \dot{U}_{J2\_L} \\ \dot{U}_{J3\_L} \\ \dot{U}_{J4\_L} \end{bmatrix} = Y_{JMod}^{-1} \begin{bmatrix} \dot{I}_{J1L} \\ 0 \\ 0 \\ 0 \end{bmatrix}$$

where
$\dot{I}_{J1L}$ is the Fourier phasor of the local node current $i_{J1L}$.

Thereafter step (c) of equating, in respect of each remote terminal $R_1$, $R_2$, $R_3$, $R_4$, $R_5$ a sum of node currents flowing into the corresponding calculation node J1, J2, J3, J4 to zero according to Kirchhoff's first law, includes:

for the first remote terminal $R_1$, equating to zero the sum of the first calculated equivalent node current $i_{J1R1\_L}$ and the first received remote node current $i'_{J1R1}$ flowing into the first junction J1;

for the second remote terminal $R_2$, equating to zero the sum of the second calculated equivalent node current $i_{J2R2\_L}$ and the second received remote node current $i'_{J2R2}$ flowing into the second junction J2;

for the third remote terminal $R_3$, equating to zero the sum of the third calculated equivalent node current $i_{J3R3\_L}$ and the third received remote node current $i'_{J3R3}$ flowing into the third junction J3;

for the fourth remote terminal $R_4$, equating to zero the sum of the fourth calculated equivalent node current $i_{J4R4\_L}$ and the fourth received remote node current $i'_{J4R4}$ flowing into the fourth junction J4; and for the fifth remote terminal $R_5$, equating to zero the sum of the fifth calculated equivalent node current $i_{J5R5\_L}$ and the fifth received remote node current $i'_{J5R5}$ again flowing into the fourth junction J4.

Following the above, step (d) of extracting, in respect of each remote terminal $R_1$, $R_2$, $R_3$, $R_4$, $R_5$, a communication time delay $T_P1$, $T_P2$, $T_P3$, $T_P4$, $T_P5$ between the local terminal L and the said respective remote terminal $R_1$, $R_2$, $R_3$, $R_4$, $R_5$ from a corresponding equated sum of node currents again includes comparing the phase of the said node currents.

Such phase comparisons can be achieved by adopting a zero-crossing method in the time domain or a Fourier transform method in the frequency domain but, by way of example, the third method of the invention again adopts a Fourier transform method in which each of the received remote node currents $i'_{J1R1}$, $i'_{J2R2}$, $i'_{J3R3}$, $i'_{J4R4}$, $i'_{J5R5}$ is rewritten in the respective form, $\dot{I}'_{J1R1} e^{j\omega_0 T_{P1}}$;

$\dot{I}'_{J2R2} e^{j\omega_0 T_{P2}}$;

$\dot{I}'_{J3R3} e^{j\omega_0 T_{P3}}$;

$\dot{I}'_{J4R4} e^{j\omega_0 T_{P4}}$; and $\dot{I}'_{J5R5} e^{j\omega_0 T_{P5}}$ such that the first, second, third, fourth and fifth communication time delays $T_P1$, $T_P2$, $T_P3$, $T_P4$, $T_P5$ are given, respectively, by $$T_{p1} = \frac{\arg(-\dot{I}_{J1R1\_L}/\dot{I}'_{J1R1})}{2\pi f};$$

$$T_{p2} = \frac{\arg(-\dot{I}_{J2R2\_L}/\dot{I}'_{J2R2})}{2\pi f};$$

$$T_{p3} = \frac{\arg(-\dot{I}_{J3R3\_L}/\dot{I}'_{J3R3})}{2\pi f};$$

$$T_{p4} = \frac{\arg(-\dot{I}_{J4R4\_L}/\dot{I}'_{J4R4})}{2\pi f}; \text{ and}$$

$$T_{p5} = \frac{\arg(-\dot{I}_{J4R5\_L}/\dot{I}'_{J4R5})}{2\pi f}$$

where,
$\dot{I}_{J1R1\_L}$ is the Fourier phasor of the first equivalent node current $i_{J1R1\_L}$;

$\dot{I}'_{J1R1}$ is the Fourier phasor of the first received remote node current $i'_{J1R1}$ transmitted from the first remote terminal $R_1$ to the local terminal L;

$\dot{I}_{J2R2\_L}$ is the Fourier phasor of the second equivalent node current $i_{J2R2\_L}$;

$\dot{I}'_{J2R2}$ is the Fourier phasor of the second received remote node current $i'_{J2R2}$ transmitted from the second remote terminal $R_2$ to the local terminal L;

$\dot{I}_{J3R3\_L}$ is the Fourier phasor of the third equivalent node current $i_{J3R3\_L}$;

$\dot{I}'_{J3R3}$ is the Fourier phasor of the third received remote node current $i'_{J3R3}$ transmitted from the third remote terminal $R_3$ to the local terminal L;

$\dot{I}_{J4R4\_L}$ is the Fourier phasor of the fourth equivalent node current $i_{J4R4\_L}$;

$\dot{I}'_{J4R4}$ is the Fourier phasor of the fourth received remote node current $i'_{J4R4}$ transmitted from the fourth remote terminal $R_4$ to the local terminal L;

$\dot{I}_{J4R5\_L}$ is the Fourier phasor of the fifth equivalent node current $i_{J4R5\_L}$;

$\dot{I}'_{J4R5}$ is the Fourier phasor of the fifth received remote node current $i'_{J4R5}$ transmitted from the fifth remote terminal $R_5$ to the local terminal L; and f is frequency of the node currents.

Following all of the above the second method of the invention optionally includes a further time alignment step.

Such a step involves delaying the local data, i.e. the measured current $i_L$ at the local terminal L, by an amount $T_{max}$ equal to the maximum value of the first, second, third, fourth, and fifth communication time delays $T_P1$, $T_P2$, $T_P3$, $T_P4$, $T_P5$, i.e. where $$T_{max} = \max\{T_P1, T_P2, T_P3, T_P4, T_P5\}$$

then delaying the first received remote node current $i'_{J1R1}$ by an amount $T_{R1}$ given by $$T_{R1} = T_{max} - T_P1$$

delaying the second received remote node current $i'_{J2R2}$ by an amount $T_{R2}$ given by $$T_{R2}=T_{max}-T_P2$$

delaying the third received remote node current $i'_{J3R3}$ by an amount $T_{R3}$ given by $$T_{R3}=T_{max}-T_P3$$

delaying the fourth received remote node current $i'_{J4R4}$ by an amount $T_{R4}$ given by $$T_{R4}=T_{max}-T_P4; \text{ and}$$

delaying the fifth received remote node current $i'_{J4R5}$ by an amount $T_{R5}$ given by $$T_{R5}=T_{max}-T_P5$$

Thereafter each of the local node current $i_{JL}$, and the received remote node $i'_{J1R1}$, $i'_{J2R2}$, $i_{J3R3}$, $i'_{J4R4}$, $i'_{J4R5}$ will be correctly synchronised with one another such that an associated differential protection scheme will be able to operate correctly and reliably.

What is claimed is:

1. A method of determining a communication time delay in a communication network between a local terminal and one or more remote terminals within an electrical power network comprising the steps of:
   (a) selecting, in respect of the or each remote terminal a calculation node in the electrical power network;
   (b) calculating, in respect of each remote terminal, a corresponding remote node current flowing into the corresponding calculation node from the said remote terminal and a corresponding equivalent node current representative of the current flowing into the corresponding calculation node from the local terminal and the or each other remote terminal;
   (c) equating, in respect of each remote terminal, a sum of the corresponding calculated equivalent node current and the corresponding remote node current flowing into the corresponding calculation node to zero according to Kirchhoff's first law; and
   (d) extracting, in respect of the or each remote terminal, a communication time delay between the local terminal and the said respective remote terminal from a corresponding equated sum of node currents,
   wherein calculating in respect of each remote terminal a corresponding equivalent node current includes:
      establishing an equivalent admittance for each remote terminal;
      obtaining a local node current; and
      utilizing the established equivalent admittances for each remote terminal and the local node current to calculate the corresponding equivalent node current.

2. A method of determining a communication time delay according to claim 1 wherein:
   each corresponding equivalent node current is calculated by the local terminal; and
   each remote node current is calculated by the corresponding remote terminal and is thereafter transmitted via the communication network to the local terminal whereat it is received as a corresponding received remote node current.

3. A method of determining a communication time delay according to claim 1, within an electrical power network having a single junction between the local terminal and the plurality of remote terminals, wherein utilizing the established equivalent admittances for each remote terminal and the local node current to calculate the corresponding equivalent local node current includes one of:
   multiplying the local node current by a current distribution coefficient based on the said established equivalent admittances; and
   adding one or more other node currents, the or each of which is determined from the equivalent admittance of another remote terminal and a corresponding calculated node voltage, to the local node current.

4. A method of determining a communication time delay according to claim 1, within an electrical power network having a plurality of junctions between the local terminal and the plurality of remote terminals, wherein utilizing the established equivalent admittances for each remote terminal and the local node current to determine the corresponding equivalent node current includes:
   using the local node current to calculate for each junction a local junction voltage; and
   multiplying the equivalent admittance for a given remote terminal by the calculated local junction voltage for the junction with which it is connected to thereby calculate the corresponding equivalent node current for the said given remote terminal.

5. A method of determining a communication time delay according to claim 4 wherein calculating for each junction a local junction voltage includes:
   formulating an initial admittance matrix based on the topology of the electrical power network;
   modifying the initial admittance matrix to take account of the established equivalent admittances for each remote terminal; and
   combining the modified admittance matrix with the local node current to thereby establish each local junction voltage.

6. A method of determining a communication time delay according to claim 1 wherein obtaining a local node current includes measuring the current at the local terminal and using the measured current at the local terminal to calculate the local node current using one of the following models of the network between the local terminal and a corresponding calculation node:
   a resistor-inductor model;
   a linear resistor-inductor-capacitor model; and
   a distributed parameter model.

7. A method of determining a communication time delay according to claim 1 wherein calculating a given remote node current includes measuring the current at the corresponding remote terminal and using the measured current at the corresponding remote terminal to calculate the said given remote node current using one of the following models of the network between the corresponding remote terminal and the corresponding calculation node:
   a resistor-inductor model;
   a linear resistor-inductor-capacitor model; and
   a distributed parameter model.

8. A method of determining a communication time delay according to claim 1 wherein step (d) of extracting, in respect of the or each remote terminal, a communication time delay between the local terminal and the said respective remote terminal from a corresponding equated sum of node currents, includes comparing the phase of the node currents within the equated sum.

9. A method of determining a communication time delay according to claim 8 wherein comparing the phase of the node currents includes one of:
   adopting a zero-crossing method in the time domain; and
   adopting a Fourier transform method in the frequency domain.

* * * * *